(12) United States Patent
Koinuma et al.

(10) Patent No.: US 7,150,788 B2
(45) Date of Patent: Dec. 19, 2006

(54) METHOD FOR MANUFACTURING IN-PLANE LATTICE CONSTANT ADJUSTING SUBSTRATE AND IN-PLANE LATTICE CONSTANT ADJUSTING SUBSTRATE

(75) Inventors: Hideomi Koinuma, Tokyo (JP); Masashi Kawasaki, Miyagi (JP); Tomoteru Fukumura, Miyagi (JP); Kota Terai, Chiba (JP)

(73) Assignee: Japan Science and Technology Agency, Kawaguchi (JP)

( * ) Notice: Subject to any disclaimer, the term of this patent is extended or adjusted under 35 U.S.C. 154(b) by 262 days.

(21) Appl. No.: 10/486,571

(22) PCT Filed: Aug. 21, 2002

(86) PCT No.: PCT/JP02/08409

§ 371 (c)(1),
(2), (4) Date: Feb. 11, 2004

(87) PCT Pub. No.: WO03/016600

PCT Pub. Date: Feb. 27, 2003

(65) Prior Publication Data

US 2004/0197936 A1 Oct. 7, 2004

(30) Foreign Application Priority Data

Aug. 21, 2001 (JP) .............................. 2001-250842

(51) Int. Cl.
*C30B 29/16* (2006.01)
(52) U.S. Cl. ..................... 117/3; 117/5; 117/8; 117/9; 117/94; 117/95
(58) Field of Classification Search .................. 117/3, 117/5, 8, 9, 94, 95
See application file for complete search history.

(56) References Cited

U.S. PATENT DOCUMENTS

| | | | | |
|---|---|---|---|---|
| 5,198,269 | A | * | 3/1993 | Swartz et al. ............... 427/226 |
| 5,656,382 | A | * | 8/1997 | Nashimoto .................. 428/620 |
| 5,943,111 | A | * | 8/1999 | McMillan .................... 349/171 |
| 6,096,434 | A | * | 8/2000 | Yano et al. .................. 428/446 |

(Continued)

FOREIGN PATENT DOCUMENTS

EP 0 390 139 10/1990

(Continued)

*Primary Examiner*—Robert Kunemund
(74) *Attorney, Agent, or Firm*—Westerman, Hattori, Daniels & Adrian, LLP.

(57) ABSTRACT

A method of adjusting the in-plane lattice constant of a substrate and an in-plane lattice constant adjusted substrate are provided. A crystalline substrate (1) made of $SrTiO_3$ is formed at a first preestablished temperature thereon with a first epitaxial thin film (2) made of a first material, e. g., $BaTiO_3$, and then on the first epitaxial thin film (2) with a second epitaxial thin film (6) made of a second material, e. g., $Ba_xSr_{1-x}TiO_3$ (where $0<x<1$), that contains a substance of the first material and another substance which together therewith is capable of forming a solid solution in a preestablished component ratio. Thereafter, the substrate is heat-treated at a second preselected temperature. Heat treated at the second preestablished temperature, the substrate has dislocations (4) introduced therein and the second epitaxial thin film (6) has its lattice constant relaxed to a value close to the lattice constant of bulk crystal of the second material. Selecting the ratio of components x of the other substance in the second material allows a desired in-plane lattice constant to be realized.

9 Claims, 9 Drawing Sheets

U.S. PATENT DOCUMENTS

| | | | |
|---|---|---|---|
| 6,198,225 B1 * | 3/2001 | Kano et al. | 315/169.3 |
| 6,610,548 B1 * | 8/2003 | Ami et al. | 438/3 |
| 6,654,529 B1 * | 11/2003 | Kawaguchi et al. | 385/122 |
| 2001/0041372 A1 * | 11/2001 | Arita et al. | 438/3 |

FOREIGN PATENT DOCUMENTS

| | | | |
|---|---|---|---|
| JP | 8-31951 | | 2/1996 |
| JP | 10001391 | * | 1/1998 |
| JP | 10-152398 | | 6/1998 |

* cited by examiner (a)

(b)

(a) (0.8 μm square)

(b) (0.6 μm square)

(c) (0.8 μm square)

METHOD FOR MANUFACTURING IN-PLANE LATTICE CONSTANT ADJUSTING SUBSTRATE AND IN-PLANE LATTICE CONSTANT ADJUSTING SUBSTRATE

TECHNICAL FIELD

The present invention relates to a method of preparing an in-plane lattice constant adjusted substrate, and an in-plane lattice constant adjusted substrate, whereby a desired in-plane lattice constant can be realized.

BACKGROUND ART

A thin film formed so that it is epitaxially grown on a crystalline substrate has its properties influenced by its crystalline perfectness. For example, in the preparation of an oxide superconductor thin film such as of (Ba, Sr) CuO type which is epitaxially grown on a substrate to form a laminated superconductor, its superconductive transition temperature and superconductive critical magnetic field are influenced by its crystalline perfectness such as its crystal defect density and crystallographic orientation. Also, an epitaxial $BaTiO_3$ thin film used as a memory element in a semiconductor integrated circuit has its capacity value largely varied by its crystallographic orientation.

So far, in order to obtain a high quality thin film that is satisfactory in crystalline perfectness, a substrate has been used having an in-plane lattice constant that is close to the in-plane lattice constant of the thin film. If there does not exist any substrate having an in-plane lattice constant close to that of a thin film, a material is chosen having an in-plane lattice constant intermediate between those of the substrate and the thin film and is layered on the substrate as a buffer layer on which the thin film may be grown.

It is, however, only rare that a substrate is available that agrees in in-plane lattice constant with the thin film, and if such a substrate is available, it often is extremely brittle or of high cost. In the use of a buffer layer, too, it rarely is the case that a substrate is available which is fully congruous in in-plane lattice constant.

Thus, in the past, since it has not been possible to grow a thin film on a substrate that fully agrees or is congruent in in-plane lattice constant therewith, it has been likely the case that a thin film has dislocations introduced therein due to its lattice mismatch with the substrate; hence a thin film results that is highly dense with crystal defects, imperfect in crystalline orientation, and thus poor in quality and properties, problems met by the prior art.

DISCLOSURE OF THE INVENTION

In view of the aforementioned problems in the prior art, the present invention has for its object to provide a method of adjusting the lattice constant of a substrate and to provide an in-plane lattice constant adjusted substrate.

In order to achieve the object mentioned above, there is provided in accordance with the present invention in a first form of implementation thereof a method of preparing an in-plane lattice constant adjusted substrate, characterized in that it comprises the steps of: growing a first epitaxial thin film made of a first material on a substrate at a first preestablished temperature; and heat-treating at a second preestablished temperature the substrate having the first epitaxial thin film grown thereon.

In the method of preparing an in-plane lattice constant adjusted substrate in accordance with the present invention, the said first preestablished temperature is a temperature that causes the said first material to epitaxially grow on the said substrate.

Also, the said second preestablished temperature is a temperature that is higher than the said first preestablished temperature but lower than the lower of melting points of the said substrate and the said first epitaxial thin film.

According to this method makeup, epitaxially growing a first material on a substrate at a first preestablished temperature causes a first epitaxial thin film having distortions due to its mismatch in in-plane lattice constant with the substrate to epitaxially grow on the substrate, and heat-treating the epitaxial thin film and the substrate at a second preestablished temperature introduces dislocations into the substrate surface and relaxes the in-plane lattice constant of the first epitaxial thin film to a value close to the lattice constant of bulk crystal of the first material. The dislocations are anchored to the interface between the substrate and the first epitaxial thin film, the top surface of the epitaxial thin film is flattened to an atomic level, and they are left immobile when another material is epitaxially grown on that surface.

In the present invention, the said substrate and the said first epitaxial thin film are preferably made of oxides. It is also preferred that the said substrate be made of $SrTiO_3$ crystal and said first epitaxial thin film be made of $BaTiO_3$.

According to this method makeup, it is possible to adjust the in-plane lattice constant of a single crystal substrate of $SrTiO_3$ which is of low cost and stout, to the lattice constant of $BaTiO_3$. Also in an application in which the in-plane lattice constant of $BaTiO_3$ is required, it can be used in place of a $BaTiO_3$ which is brittle and of high cost. For example, it becomes possible to manufacture at a low cost $BaTiO_3$ capacitors which are high in dielectric constant.

The present invention also provides in another form of implementation thereof a method of preparing an in-plane lattice constant adjusted substrate, characterized in that it comprises the steps of: forming on a single crystal substrate whose surface is flat on an atomic level, a first epitaxial thin film having a first preselected film thickness and made of a first material that is different from a material of which the substrate is made, and then forming on the first epitaxial thin film, a second epitaxial thin film having a second preselected film thickness and made of a second material that contains, at a predetermined ratio of components, a substance of said first material and another substance which is capable of forming a solid solution; and thereafter heat-treating them at a second preestablished temperature that is higher than an epitaxial growth temperature of the said first and second epitaxial thin films but lower than the lowest of melting points of the said substrate, the said first epitaxial thin film and the said second epitaxial thin film to introduce dislocations into an interface between the said substrate and the said first epitaxial thin film and an interface between the said first and second epitaxial thin films, whereby a modification of the said substrate ensures having an in-plane lattice constant of the said second epitaxial thin film controllably determined by a ratio of the said first to second film thickness and/or a said predetermined ratio of components and having the top surface of the said second epitaxial thin film flattened to an atomic level.

Also, the said second epitaxial thin film may be formed to the second preselected film thickness on the said substrate without using the said first epitaxial thin film made of the first material and may thereafter be heat-treated at the second preestablished temperature.

According to this method makeup, on the substrate there is allowed to epitaxially grow a first epitaxial thin film having distortions due to its mismatch in in-plane lattice constant with the substrate, and on the first epitaxial thin film there is allowed to grow epitaxially a second epitaxial thin film having distortions due to its mismatch in in-plane lattice constant with the first epitaxial thin film, and then heat-treating them at a second preestablished temperature introduces dislocations into the substrate surface and into the interface between the first and second epitaxial thin films and relaxes the in-plane lattice constants of the first and second epitaxial thin films to values close to the lattice constant of the bulk crystal of the second material.

The dislocations are anchored to the interfaces between the substrate and the first epitaxial thin film and between the latter and the second epitaxial thin film, the top surface of the second epitaxial thin film is flattened to an atomic level, and the dislocations are left immobile when another material is caused to grow epitaxially on that surface.

Suitably selecting the ratio of components of the other substance in the said second material allows a desired in-plane lattice constant determined by the selected ratio of components and hence a substrate having such a desired in-plane lattice constant to be obtained.

Further, the said substrate and the said first and second epitaxial thin films are preferably made of oxides. It is preferred that the said substrate be a $SrTiO_3$ crystalline substrate, the said first epitaxial thin film be made of $BaTiO_3$ and the said second epitaxial thin film be made of $Ba_xSr_{1-x}TiO_3$ where $0<x<1$.

According to this method makeup, suitably selecting x allows forming a substrate which agrees in in-plane lattice constant with a thin film to be formed thereon. Thus, for example, such a substrate can be used for forming a (Ba, Sr) CuO or like oxide superconductor thin film thereon. Then, since a substrate can be formed which by selecting x suitably is made substantially identical in in-plane lattice constant to a superconductor layer to be formed thereon, it becomes possible to obtain an oxide high-temperature superconductor film that extremely excels in quality. It is also possible to adjust the in-plane lattice constant of the second epitaxial thin film by adjusting the ratio in film thickness of the first to second epitaxial thin film.

The present invention also provides an in-plane lattice constant adjusted substrate, characterized in that it comprises a crystalline substrate made of $SrTiO_3$ and having a thin film of $BaTiO_3$ formed thereon, wherein the $BaTiO_3$ thin film has its top surface flattened to an atomic level and is substantially equal in lattice constant to $BaTiO_3$ bulk crystal. A substrate so made up may be used, in an application in which a $BaTiO_3$ substrate is required, to replace the same which is brittle and of high cost.

The present invention also provides a in-plane lattice constant adjusted substrate, characterized in that it comprises a crystalline substrate made of $SrTiO_3$ and having a thin film of $BaTiO_3$ formed thereon and a thin film of $Ba_xSr_{1-x}TiO_3$ (where $0<x<1$) formed on the $BaTiO_3$ thin film, wherein the $Ba_xSr_{1-x}TiO_3$ thin film has its top surface flattened to an atomic level and has its lattice constant adjustable to a desired length between the lattice constants of $SrTiO_3$ and $BaTiO_3$ bulk crystals by selecting x. A substrate so made up can be used in forming a thin film thereon. Then, since a substrate can be formed that agrees in in-plane lattice constant to a thin film to be formed thereon, it is possible to form a thin film that extremely excels in quality.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings:

FIG. 5 shows images of a specimen comprising a $SrTiO_3$ substrate with a $BaTiO_3$ thin film epitaxially grown thereon in the first form of implementation of the present invention, which is taken by a transmission electron diffraction microscope (TEM) in a direction perpendicular to the substrate surface, wherein FIG. 5(a) is an TEM image where spots therein correspond to lattice points and FIG. 5(b) is a figure obtained when the image of FIG. 5(a) is processed so as to visualize the continuity of lattice planes;

FIG. 6 shows images of a specimen comprising a $SrTiO_3$ substrate having a $BaTiO_3$ thin film epitaxially grown on it and thereafter heat-treated in the first form of implementation of the present invention, which is taken by the transmission electron diffraction microscope (TEM) in a direction perpendicular to the substrate surface, wherein FIG. 6(a) is an TEM image where spots therein correspond to lattice points and FIG. 6(b) is a figure obtained when the image of FIG. 6(a) is processed so as to visualize the continuity of lattice planes;

BEST MODES FOR CARRYING OUT THE INVENTION

Figure 1:
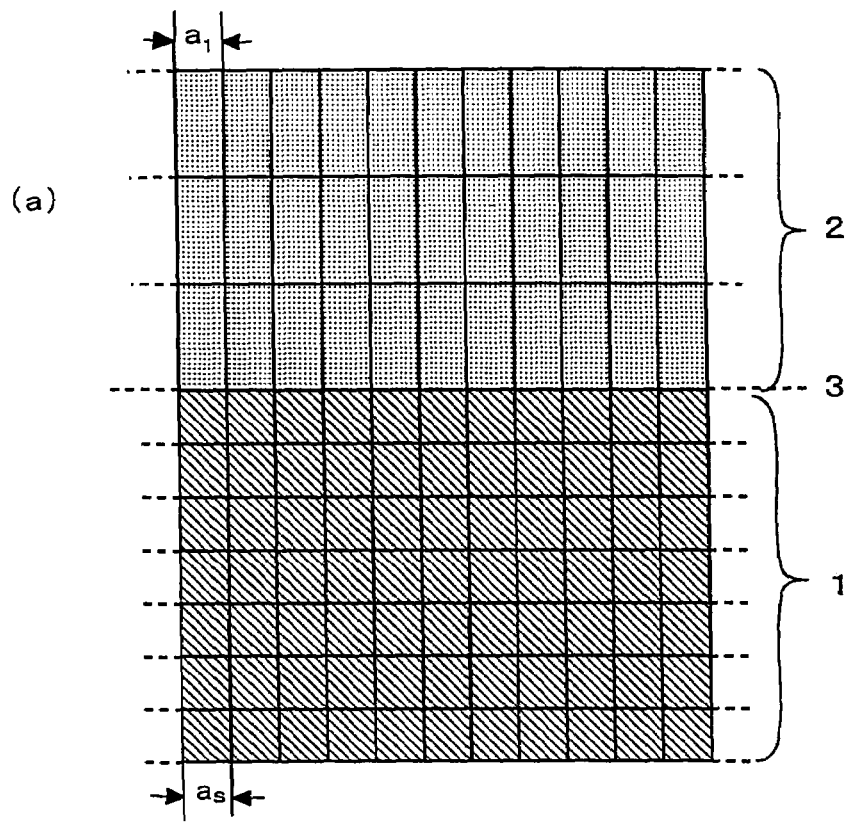
FIG. 1 shows typical views illustrating the principles of preparing an in-plane lattice constant adjusted substrate according to a first form of implementation of the present invention.
Figure 1:
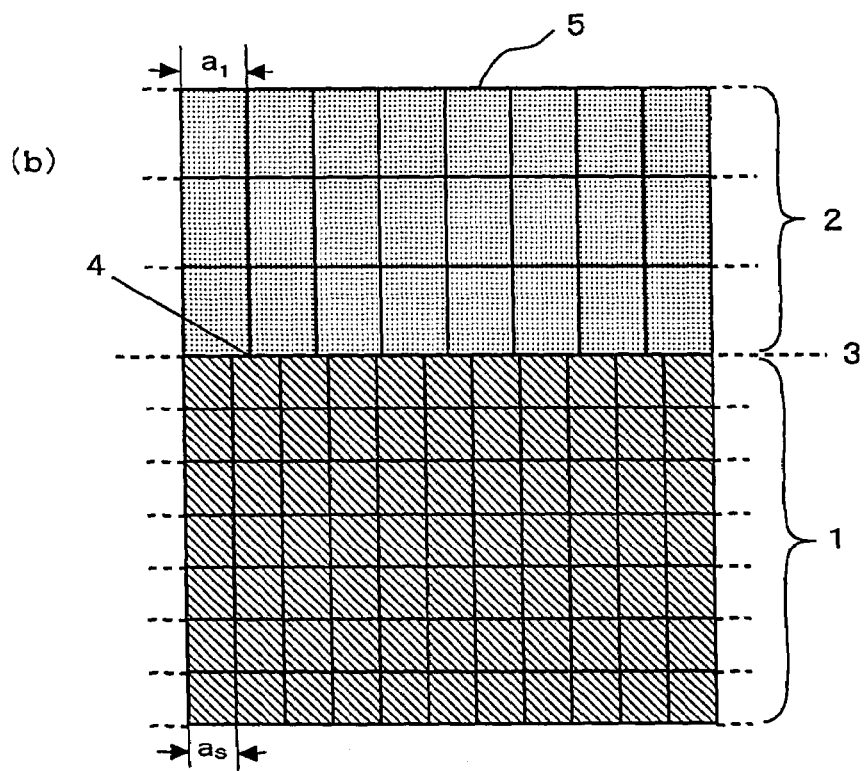

Hereinafter, the present invention will be described in detail with reference to certain suitable forms of implementation thereof illustrated in the drawing figures.

At the outset, mention is made of a first form of implementation of the present invention.

FIG. 1 shows typical views illustrating the principles of preparing an in-plane lattice constant adjusted substrate according to a first form of implementation of the present invention wherein a substrate 1 has a first epitaxial thin film 2 of a first material formed thereon. FIG. 1(a) shows a state in crystal lattice of the substrate 1 and the first epitaxial thin film 2 typically in a cross section taken perpendicular to a surface 3 of the substrate. The crystal lattices in the substrate 1 and those in the first epitaxial thin film 2 are typically represented by squares and rectangles, respectively, as shown. FIG. 1(b) shows a state of the crystal lattice after the heat-treatment of the substrate 1 formed with the first epitaxial thin film 2 on it, which are shown typically in a cross section taken perpendicular to the substrate surface 3. The crystal lattices in the substrate 1 and those in the first epitaxial thin film 2 after the heat treatment are again typically represented by squares and rectangles, respectively, as shown.

The method of preparing an in-plane crystal lattice adjusting substrate comprises a first step of supplying the substrate 1 at a first preestablished temperature with a first material over it to grow a first epitaxial thin film 2 composed of the first material on the substrate 1. The first preestablished temperature may be any low or high temperature if it allows the epitaxial growth of the first epitaxial thin film 2. Here, any epitaxial growth process, such as MOCVD, CVD or laser ablation, may be adopted in epitaxially growing the first material on the substrate 1.

As shown in FIG. 1(a), the first epitaxial thin film 2 is formed on the substrate so that the lattice planes in the first epitaxial thin film 2 are substantially continuous with those in the substrate 1 and that the in-plane lattice constant $a_1$ in the first epitaxial thin film 2 is substantially equal to the in-plane lattice constant as in the substrate 1. Also the lattice constant of the first epitaxial thin film 2 in a direction perpendicular to the substrate surface 3 is different from the lattice constant of the first material in its bulk state. Therefore the first epitaxial thin film 2 is grown on the substrate 1 in a state that it has distortions due to its mismatch in in-plane lattice constant with the substrate 1.

Then, the substrate 1 on which the first epitaxial thin film 2 has been grown is heat-treated at a second preestablished temperature, which is a temperature higher than the first preestablished temperature, but lower than the lower of the melting points of the substrate 1 and the first epitaxial thin film 2.

With this heat treatment, as shown in FIG. 1(b), a dislocation 4 is introduced into the substrate surface 3 while the distortions in the first epitaxial thin film 2 is relieved with the result that the in-plane lattice constant $a_1$ in the first epitaxial thin film 2 becomes substantially equal to the lattice constant of the first material in its bulk state. Further, its lattice constant in a direction perpendicular to the substrate surface 3 also relaxes and becomes substantially equal to the lattice constant in its bulk state. The dislocations 4 are anchored to the substrate surface 3 while the first epitaxial thin film 2 has its top surface 5 flattened to an atomic level, thereby permitting another material to grow epitaxially thereon while leaving the dislocations 4 anchored immobile.

Mention is next made of a second form of implementation of the present invention.

Figure 2:
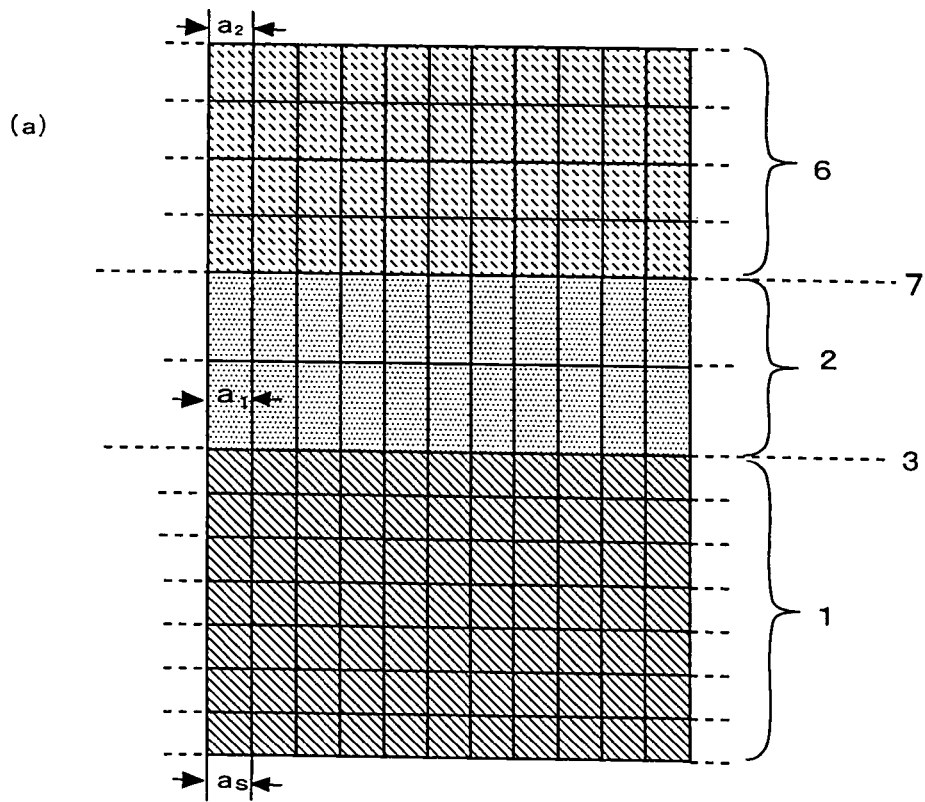
FIG. 2 shows typical views illustrating the principles of preparing an in-plane lattice constant adjusted substrate according to a second form of implementation of the present invention.
Figure 2:
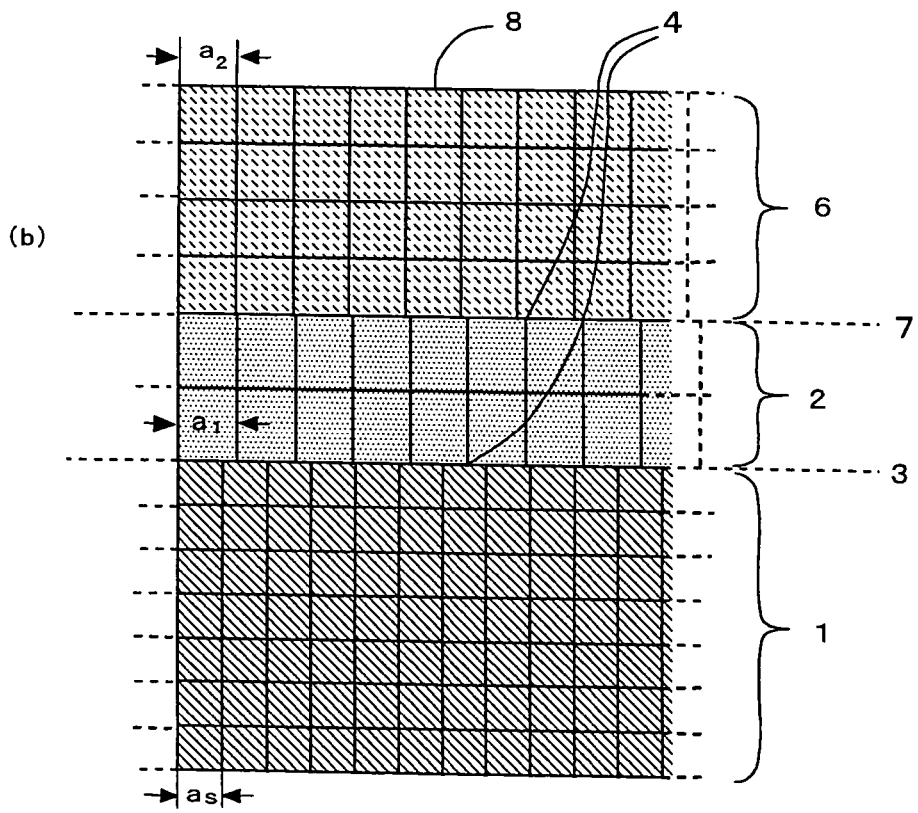

FIG. 2 shows typical views illustrating the principles of preparing an in-plane lattice constant adjusted substrate according to a second form of implementation of the present invention, wherein a substrate 1 has a first epitaxial thin film 2 of a first material formed thereon by a preselected film thickness, which in turn has a second epitaxial thin film 6 of a second material formed thereon by a predetermined thickness. FIG. 2(a) shows a state in crystal lattice of the substrate 1, the first epitaxial thin film 2 and the second epitaxial thin film 6 typically in a cross section taken perpendicular to a surface 3 of the substrate 1. The crystal lattices of the substrate 1 and the crystal lattices of the first and second epitaxial thin films 2 and 6 are typically represented by squares and rectangles, respectively, as shown.

FIG. 2(b) shows a state in crystal lattice of the substrate 1 and the first and second epitaxial thin films 2 and 6 which are formed as mentioned above and then are heat-treated at a second preestablished temperature. The state is shown typically in a cross section taken perpendicular to the substrate surface 3. The crystal lattices of the substrate 1 and those of the first and second epitaxial thin films 2 and 6 are again typically represented by squares and rectangles, respectively, as shown.

The method of a preparing an in-plane lattice constant adjusted substrate of the present invention in this form of implementation comprises a first step of supplying a substrate 1 at a first preestablished temperature with a first material over it to grow a first epitaxial thin film 2 of a first predetermined film thickness on the substrate 1 and subsequently supplying a second material to grow a second epitaxial thin film 6 of a second predetermined film thickness thereon. Here, the first predetermined film thickness is made sufficiently thinner than the second predetermined film thickness. The second material should contain a substance of the first material and another substance that is capable of forming a solid solution together with that substance, at a preselected ratio of components. The first preestablished temperature may be any low or high temperature if it allows the epitaxial growth of the thin film. Here, any epitaxial growth process, such as MOCVD, CVD or laser ablation, may be adopted in epitaxially growing the first and second materials on the substrate 1.

As shown in FIG. 2(a), the first and second epitaxial thin films are formed on the substrate so that the lattice planes in the first and second epitaxial thin films 2 and 6 are substantially continuous mutually and with those in the substrate 1 and that the in-plane lattice constants $a_1$ and $a_2$ in the first and the second epitaxial thin films 2 and 6 are substantially equal to the in-plane lattice constant $a_s$ in the substrate 1. Therefore, the first and second epitaxial thin films 2 and 6 are epitaxially grown on the substrate 1 in a state that they have distortions due to their mismatch in in-plane lattice constant.

Then, the substrate 1 on which the epitaxial thin films 2 and 6 have been grown is heat-treated at a second preestablished temperature which is a temperature higher than the first preestablished temperature, but lower than the lowest of the melting points of the substrate 1 and the first and second epitaxial thin films 2 and 6. With this heat treatment, as shown in FIG. 2(b), dislocations 4 are introduced into both the substrate surface 3 and the interface 7 between the first and second epitaxial thin films 2 and 6 or the substrate surface 3 alone to relax the in-plane lattice constants in the first and second epitaxial thin films 2 and 6. Further, with the first predetermined film thickness made sufficiently thinner than the second predetermined film thickness, the in-plane lattice constants of the first and second epitaxial thin films 2 and 6 relax to a value close to the lattice constant of the second material in its bulk crystal state. The in-plane lattice constant $a_2$ changes according to the component ratio of the second material, namely the ratio in amount of the substance of the first material to the other substance forming the solid solution together therewith. Their lattice constants in a direction perpendicular to the substrate surface 3 also relax. The dislocations 4 are anchored to both the substrate surface 3 and the interface 7 or to the substrate surface 3 alone while the second epitaxial thin film 6 has its top surface 8 flattened to an atomic level, thereby permitting another material to grow epitaxially thereon while leaving the dislocations anchored immobile.

The present invention thus enables the in-plane lattice constant of a substrate to be adjusted to a desired value, thereby permitting a device preparation process using an epitaxial thin film to be furnished with a substrate having an optimum in-plate lattice constant.

Mention is next made of a specific example of the first form of implementation of the present invention.

A specific example is here shown in which a substrate of $SrTiO_3$ crystal is adjusted to have a in-plane lattice constant of $BaTiO_3$. As a specimen the $SrTiO_3$ crystal substrate was formed thereon at an epitaxial growth temperature of 650° C. with an epitaxial thin film of $BaTiO_3$ as the first epitaxial thin film to a film thickness of 120 angstroms by laser ablation in a vacuum chamber, and then in the same vacuum chamber was heat-treated to a temperature of about 1350° C. for a period of about 1 hour by laser heating.

Figure 3:
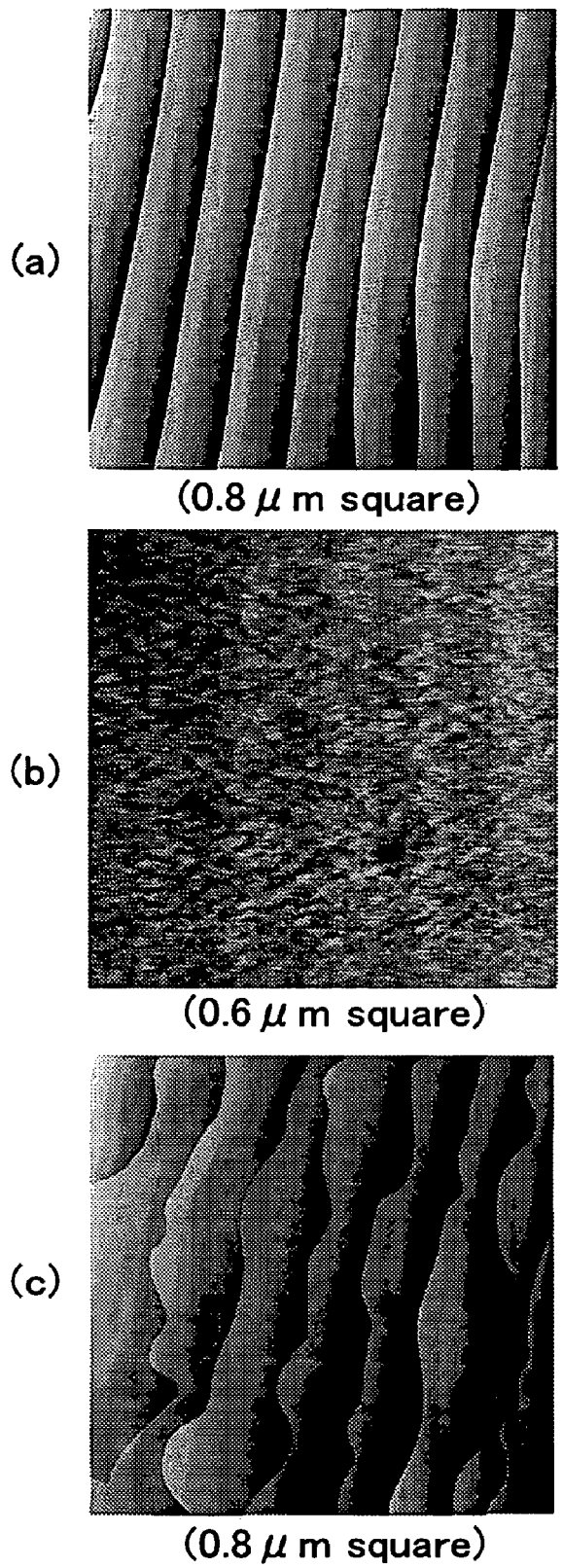
FIG. 3 shows images by a scanning tunnel electron microscope of a substrate surface, an epitaxial thin film surface before a heat treatment and the epitaxial thin film surface after the heat treatment in the first form of implementation of the present invention.
Figure 4:
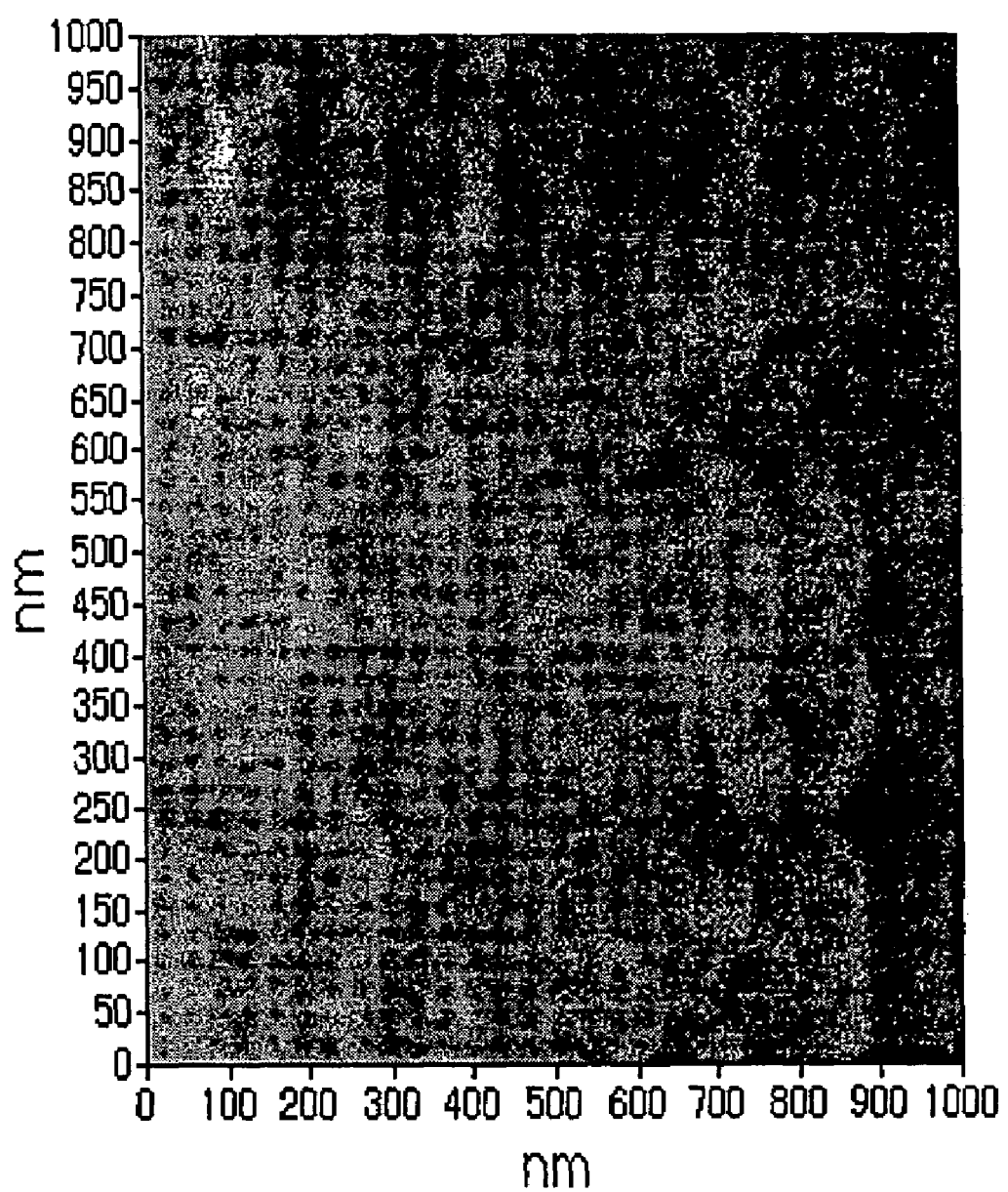
FIG. 4 shows an image taken by an atomic force microscope (AFM) of an in-plane lattice constant adjusted substrate surface according to the first form of implementation of the present invention.

FIG. 3 shows images by a scanning tunnel electron microscope of a substrate surface, an epitaxial thin film surface before the heat treatment and an epitaxial thin film surface after the heat treatment. The $BaTiO_3$ epitaxial thin film grown on the $SrTiO_3$ crystal substrate whose surface is flat on an atomic level as shown in FIG. 3(a) is seen to have a top surface that is keenly irregular or uneven as shown in FIG. 3(b). With the heat treatment applied to the substrate, a film top surface that is flat or even on an atomic level as shown in FIG. 3(c) has obtained. Each of vertical stripes in FIGS. 3(a) and 3(c) represents an atomic surface step which corresponds to mono-molecular layer, and a region between the adjacent vertical stripes represents an identical atomic surface. FIG. 4 shows an image taken by an atomic force microscope (AFM) of the surface of the specimen after the heat treatment. Each of vertical stripes seen in the figure represents atomic surface step which corresponds to mono-molecular layer, and a region between the adjacent vertical stripes represents an identical atomic surface. From FIGS. 3 and 4, it is seen that the top surface of the $BaTiO_3$ epitaxial thin film is flat and even on an atomic level.

Figure 5:
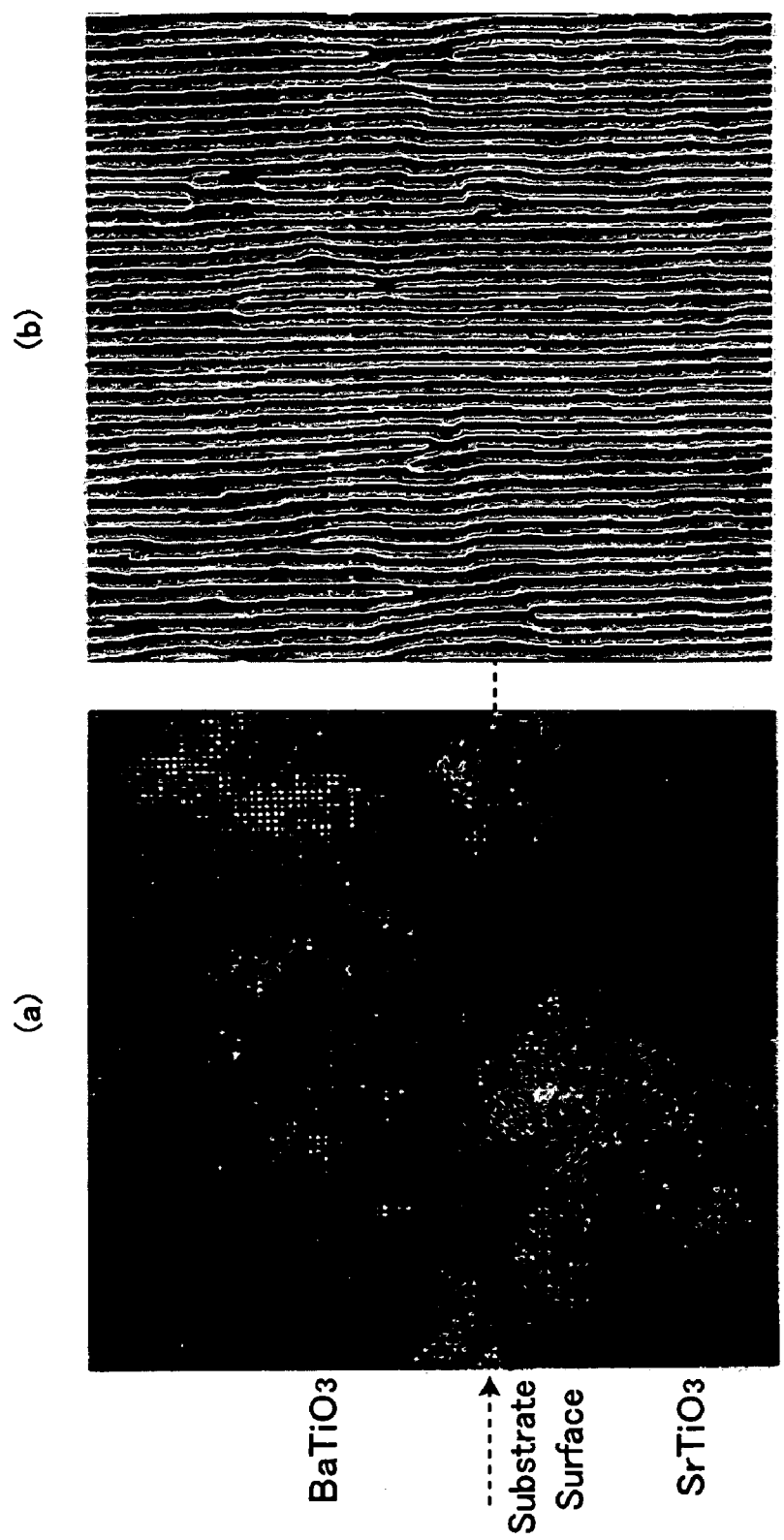

FIG. 5 shows images of a specimen comprising a $SrTiO_3$ substrate with a $BaTiO_3$ thin film epitaxially grown thereon, which is taken by a transmission electron diffraction microscope (TEM) in a direction perpendicular to the substrate surface, wherein FIG. 5(a) is an TEM image where spots therein correspond to lattice points and FIG. 5(b) is a figure obtained when the image of FIG. 5(a) is processed so as to visualize the continuity of lattice planes. From FIG. 5 it is seen that the substrate and the epitaxial thin film are almost continuous with each other in lattice planes and that the epitaxial thin film has a large number of discontinuities of lattice planes, namely dislocations therein.

Figure 6:
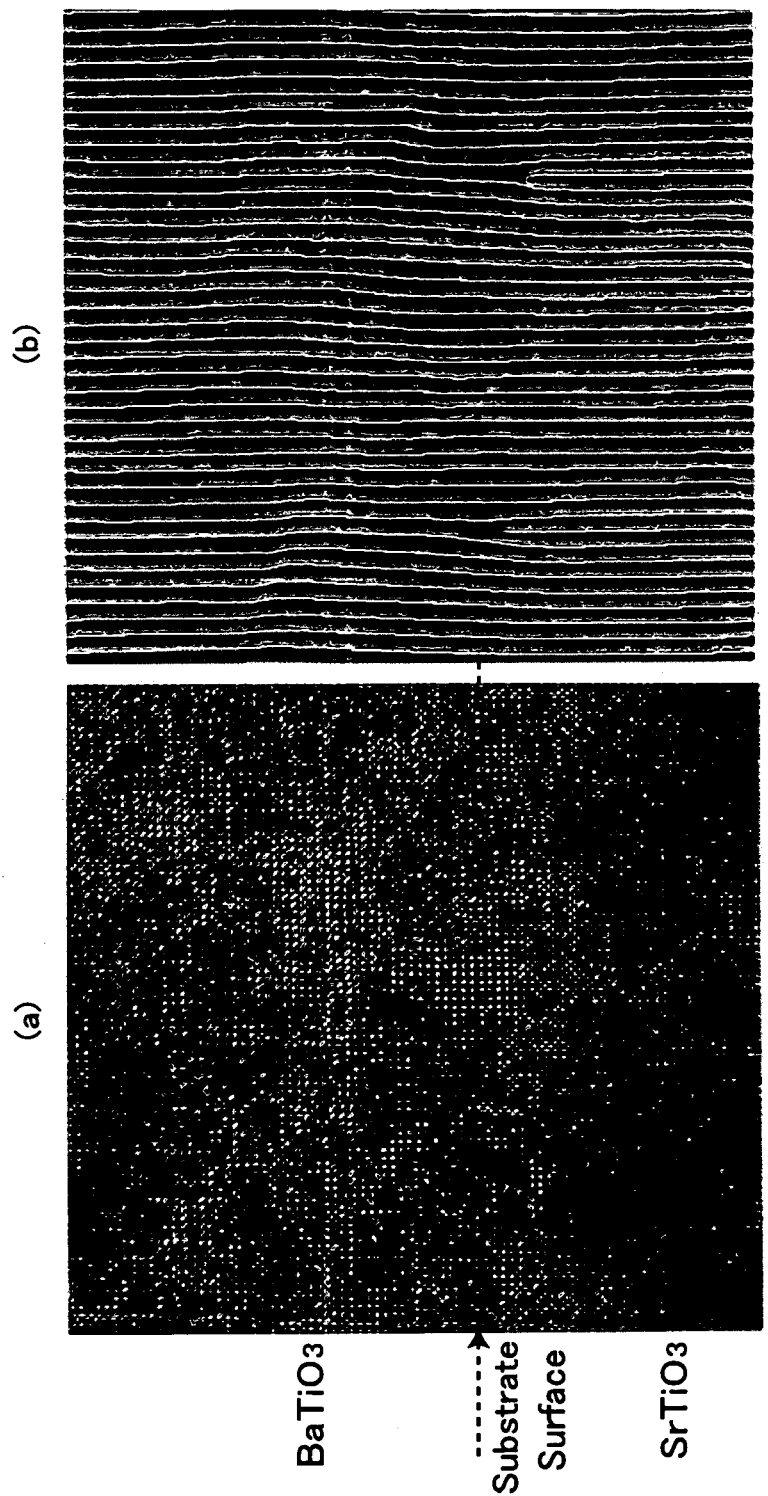

FIG. 6 shows images of a specimen comprising a $SrTiO_3$ substrate having a $BaTiO_3$ thin film epitaxially grown on it and thereafter heat-treated, which is taken by the transmission electron diffraction microscope (TEM) in a direction perpendicular to the substrate surface, wherein FIG. 6(a) is an TEM image where spots therein correspond to lattice points and FIG. 6(b) is a figure obtained when the image of FIG. 6(a) is processed so as to visualize the continuity of lattice planes. In FIG. 6(a) it is seen that lattice points lie more orderly than in FIG. 5(a). From FIG. 6(b) it is seen that dislocations exist only on the substrate surface, and not at all on epitaxial thin film. From these results it is seen that according to the method of the present invention the dislocations are anchored to the substrate surface and the top surface of the first epitaxial thin film is flattened to an atomic level.

Figure 7:
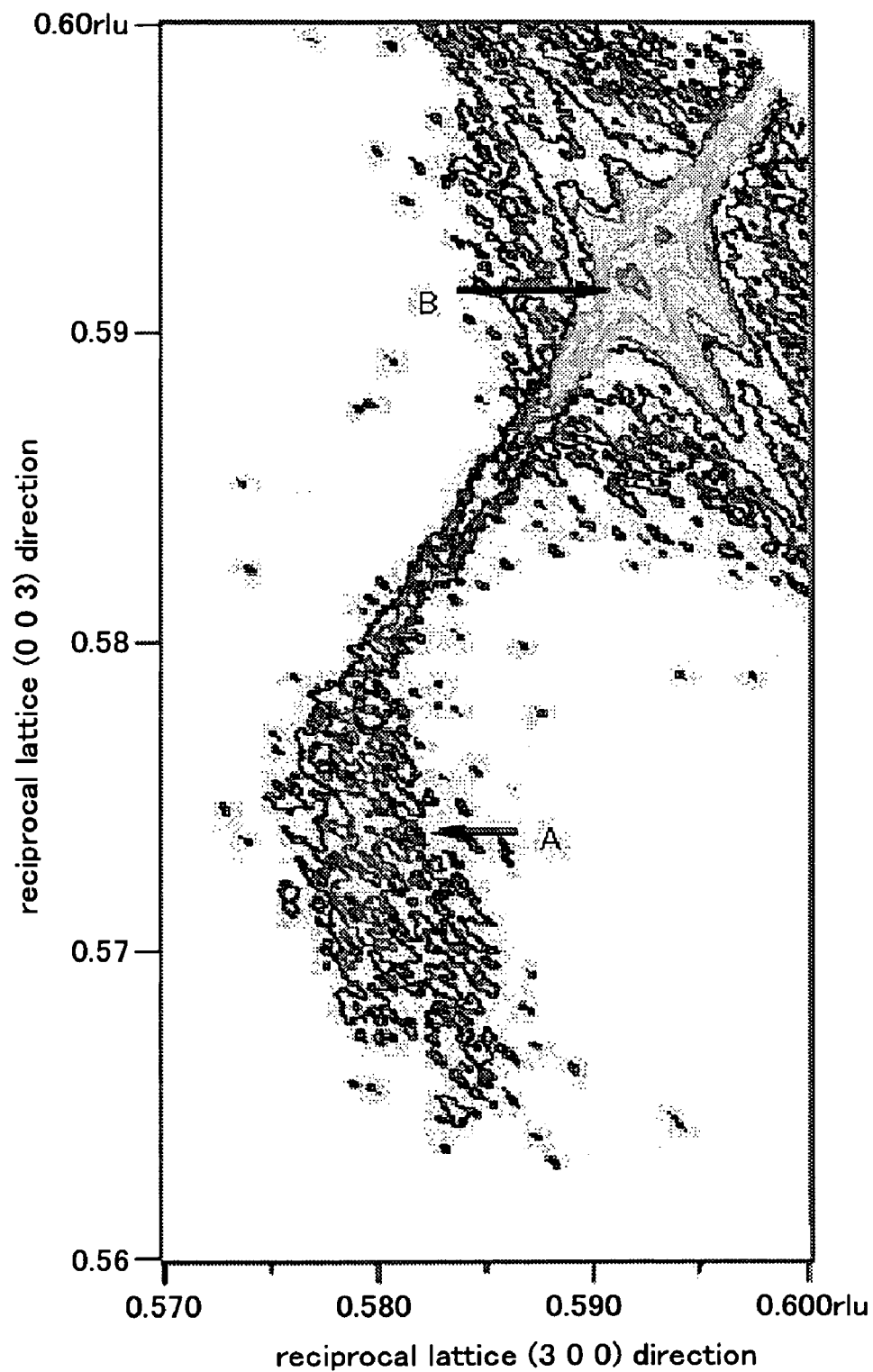
FIG. 7 is a chart illustrating a result of measurement by a four-axis X-ray diffraction apparatus of a distribution of lattice constants in an in-plane lattice constant adjusted substrate according to the first form of implementation of the present invention.

FIG. 7 is a chart illustrating a result of measurement by a four-axis X-ray diffraction apparatus of a distribution of lattice constants in the specimen mentioned above. In the chart, the abscissa and ordinate axes are taken in the (300) and (003) directions of a reciprocal lattice space, respectively. In the chart, the point A indicates the diffraction point of the $BaTiO_3$ epitaxial thin film where its diffraction intensity is the maximum, and the point B indicates the diffraction point of the $SrTiO_3$ crystal substrate where its diffraction intensity is the maximum. From the coordinate of point A it is seen that the in-plane lattice constant a of the $BaTiO_3$ epitaxial thin film is 3.990 angstroms, which is approximately equal to the lattice constant of $BaTiO_3$ bulk crystal (a=4.000 angstroms). It is seen that according to the method of the present invention, the in-plane lattice constant of the first epitaxial thin film is relaxed to the lattice constant of its bulk crystal.

Mention is next made of a specific example of the second form of implementation of the present invention. Here, a specific example is shown in which a substrate of $SrTiO_3$ crystal is adjusted to have a desired in-plane lattice constant. As a specimen the $SrTiO_3$ crystal substrate was formed thereon at an epitaxial growth temperature of 650° C. with an epitaxial thin film of $BaTiO_3$ as a first epitaxial thin film to a film thickness of 120 angstroms and then formed thereon at an epitaxial growth temperature of 650° C. with an epitaxial thin film of $Ba_{0.5}Sr_{0.5}TiO_3$ as a second epitaxial thin film to a film thickness of 1800 angstroms, each by laser ablation in a vacuum chamber, and then in the same vacuum chamber was heat-treated to a temperature of about 1350° C. for a period of about 1 hour by laser heating.

Figure 8:
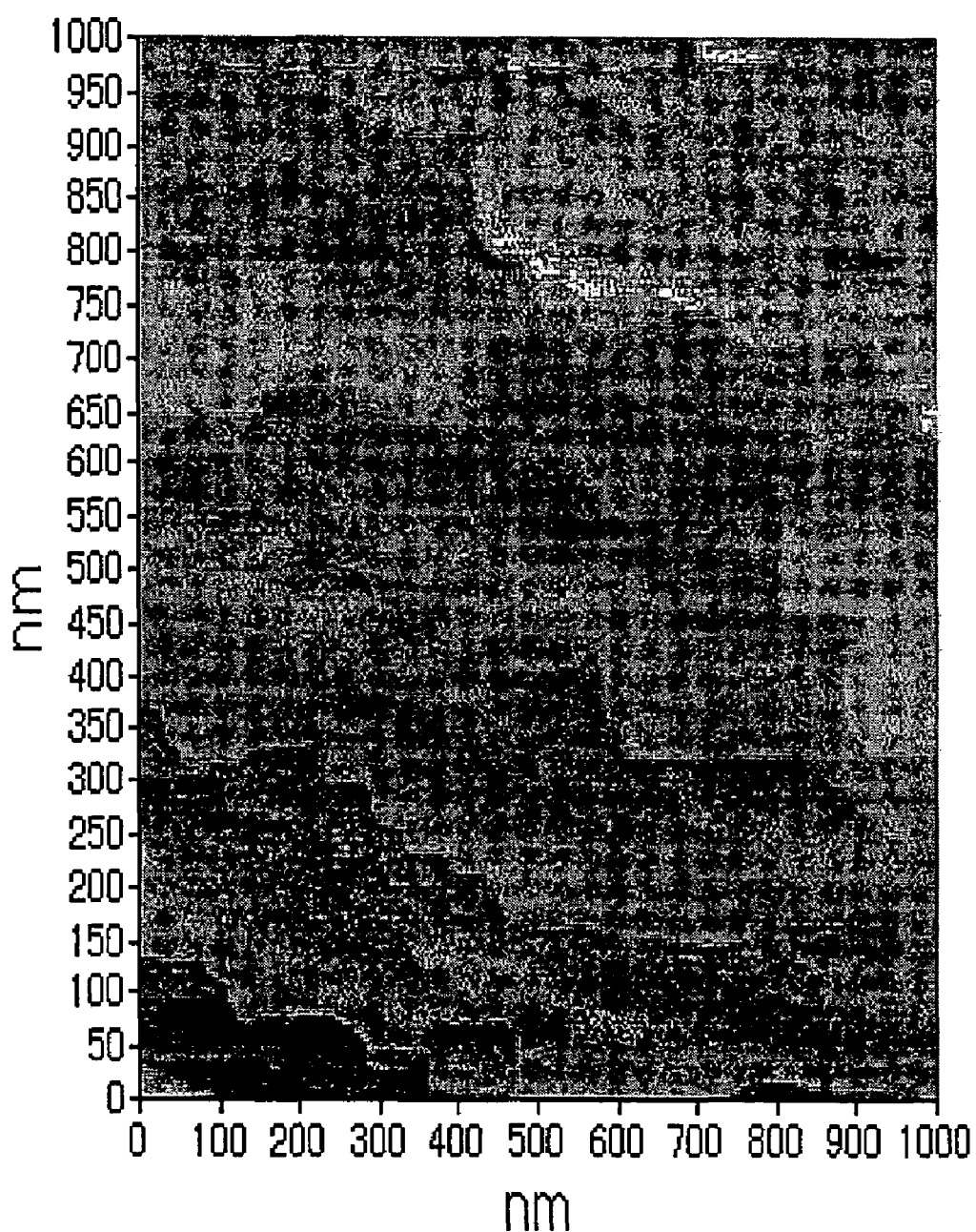
FIG. 8 shows an image by the atomic force microscope (AFM) of the surface of an in-plane lattice constant adjusted substrate according to the second form of implementation of the present invention.

FIG. 8 shows an image taken by the atomic force microscope (AFM) of the surface of the specimen after the heat treatment. In the Figure, vertical stripes represent atomic surface steps each of which corresponds to mono-molecular layer, and a region between the adjacent vertical stripes represents an identical atomic surface. From the Figure it is seen that the surface of $Ba_{0.5}Sr_{0.5}TiO_3$ epitaxial thin film is flat on an atomic level. Thus, according to the method of the present invention, the dislocations are anchored to the substrate surface, and the surface of the second epitaxial thin film is flattened to an atomic level.

Figure 9:
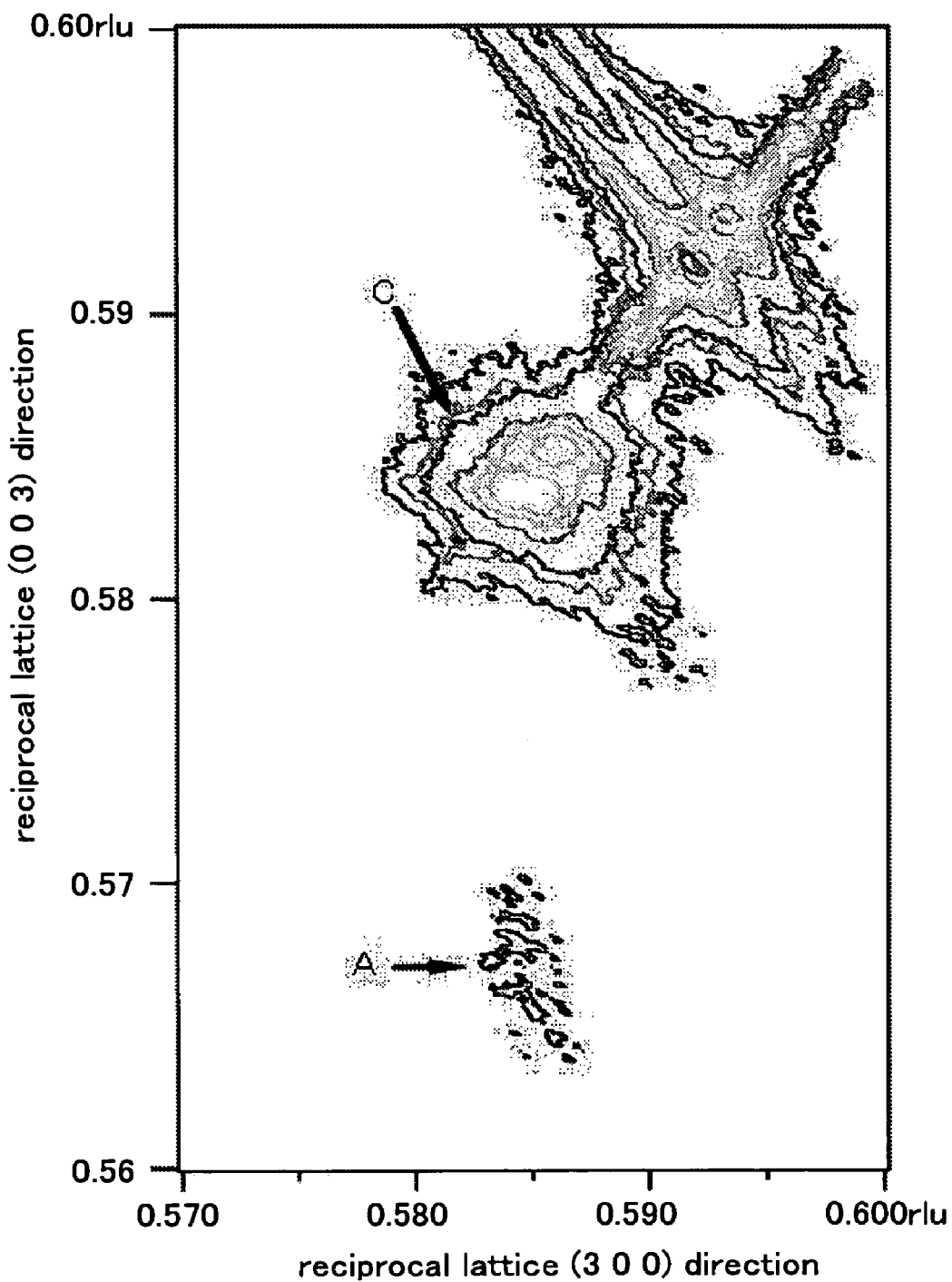
FIG. 9 shows an image by the four-axis X-ray diffraction apparatus of a distribution of lattice constants in an in-plane lattice constant adjusted substrate according to the second form of implementation of the present invention.

FIG. 9 is a figure illustrating a result of measurement by a four-axis X-ray diffraction apparatus of a distribution of lattice constants in the specimen mentioned above. In the figure, the abscissa and ordinate axes are taken in the (300) and (003) directions of a reciprocal lattice space, respectively. In the figure, the point C indicates the diffraction point of the $Ba_{0.5}Sr_{0.5}TiO_3$ epitaxial thin film as the second epitaxial thin film where its diffraction intensity is the maximum, and the point A indicates the diffraction point of the $BaTiO_3$ epitaxial thin film as the first epitaxial thin film where its diffraction intensity is the maximum. From the coordinate of point C it is seen that the in-plane lattice constant a of the $Ba_{0.5}Sr_{0.5}TiO_3$ epitaxial thin film is 3.905 angstroms, which is a value as a lattice constant intermediate between the lattice constant of $SrTiO_3$ bulk crystal of the substrate (a=3.905 angstroms) and the lattice constant of $BaTiO_3$ bulk crystal (a=4.000 angstroms). From the coordinate of point A it is seen that the in-plane lattice constant a of the $BaTiO_3$ epitaxial thin film as the first epitaxial thin film is 3.955 angstroms, which is a value as a lattice constant approximately equal to the in-plane lattice constant of $Ba_{0.5}Sr_{0.5}TiO_3$ mentioned above. The fact that the film thickness of $Ba_{0.5}Sr_{0.5}TiO_3$ being 1800 angstroms is much thicker than the film thickness of $BaTiO_3$ being 120 angstroms allows the in-plane lattice constant of the $BaTiO_3$ epitaxial thin film as the first epitaxial thin film to take a value close to the in-plane lattice constant of $Ba_{0.5}Sr_{0.5}TiO_3$.

Changing the ratio in thickness of the first to the second epitaxial growth films changes the in-plate lattice constants of the first and second epitaxial thin films. It is also possible to adjust the in-plane lattice constants by way of only the film thickness of the second epitaxial thin film.

While in this specific example the ratio x of components is made 0.5, it will be apparent that suitably changing the ratio x allows realizing a desired in-plane lattice constant intermediate between the lattice of substrate $SrTiO_3$ (a=3.952 angstroms) and the lattice constant of bulk $BaTiO_3$ (a=4.000). According to the method of the present invention it is thus seen that suitably selecting the ratio of component x allows adjusting the in-plane lattice constant of a second epitaxial thin film to have a desired value.

While in the foregoing description the heat-treatment temperature is shown to be lower than the melting points of materials used, some materials have constituent atoms diffusing in their solid state. With such materials, it is desirable that the heat treatment be effected at a temperature lower than their solid-state diffusion starting temperatures, namely their sintering temperatures.

Also, while in the foregoing specific examples, an example is taken of oxides having a perovskite-type crystallographic structure, it should be apparent that the oxides may be those having a different crystallographic structure, e. g., of a hexagonal system. It should also be apparent that the materials to which the present invention is applicable are not limited to oxides and may be any other materials.

INDUSTRIAL APPLICABILITY

As will be appreciated from the foregoing description, the present invention makes it possible to adjust the in-plane lattice constant of a substrate to have a desired value. Accordingly, the use of an in-plane lattice constant adjusted substrate of the present invention for a device utilizing an epitaxial thin film allows the device to be prepared having an extremely high quality. The present invention is extremely useful when used as a substrate, e. g., for high temperature oxide superconducting device.

What is claimed is:

1. A method of preparing an in-plane lattice constant adjusted substrate, characterized in that it comprises the steps of:
    forming at a first preestablished temperature on a single crystal substrate whose surface is flat on an atomic level, a first epitaxial thin film made of a first material that is different from a material of which the substrate is made; and
    heat-treating at a second preestablished temperature the substrate having the first epitaxial thin film formed thereon, wherein
    said first preestablished temperature is a temperature that causes said first epitaxial thin film to epitaxially grow on said substrate; and
    said second preestablished temperature is a temperature that is higher than said first preestablished temperature but lower than the lower of melting points of said substrate and said first epitaxial thin film, whereby
    the heat treatment at the second preestablished temperature gives rises to a modification of said substrate such that dislocations are introduced into an interface between the substrate and the first epitaxial thin film whereby the in-plane lattice constant of the first epitaxial thin film is altered to have a value that is close to a bulk lattice constant of said first material, and such that the top surface of said first epitaxial thin film is flattened to an atomic level.

2. A method of preparing an in-plane lattice constant adjusted substrate as set forth in claim 1, characterized in that said substrate and said first epitaxial thin film are made of oxides.

3. A method of preparing an in-plane lattice constant adjusted substrate as set forth in claim 1, characterized in that said substrate is a $SrTiO_3$ crystalline substrate and said first epitaxial thin film is made of $BaTiO_3$.

4. A method of preparing an in-plane lattice constant adjusted substrate, characterized in that it comprises the steps of:
    forming on a single crystal substrate whose surface is flat on an atomic level, a first epitaxial thin film having a first preselected film thickness and made of a first material that is different from a material of which the substrate is made, and then forming on the first epitaxial thin film, a second epitaxial thin film having a second preselected film thickness and made of a second material that contains, at a predetermined ratio of components, a substance of said first material and another substance which is capable of forming a solid solution; and thereafter
    heat-treating them at a second preestablished temperature that is higher than an epitaxial growth temperature of said first and second epitaxial thin films but lower than the lowest of melting points of said substrate, said first epitaxial thin film and said second epitaxial thin film to introduce dislocations into an interface between said substrate and said first epitaxial thin film and an interface between said first and second epitaxial thin films,
    whereby a modification of said substrate ensures having an in-plane lattice constant of said second epitaxial thin film controllably determined by a ratio of said first to second film thickness and/or a said predetermined ratio of components and having the top surface of said second epitaxial thin film flattened to an atomic level.

5. A method of preparing an in-plane lattice constant adjusted substrate as set forth in claim 4, characterized in that said second epitaxial thin film is formed having an in-plane lattice constant controllably determined by only a ratio of components thereof without forming said first epitaxial thin film made of the first material.

6. A method of preparing an in-plane lattice constant adjusted substrate as set forth in claim 4, characterized in that said substrate and said first and second epitaxial thin films are made of oxides.

7. A method of preparing an in-plane lattice constant adjusted substrate as set forth in claim 4, characterized in that said substrate is a $SrTiO_3$ crystalline substrate, said first epitaxial thin film is made of $BaTiO_3$ and said second epitaxial thin film is made of $Ba_xSr_{1-x}TiO_3$ where 0<x<1.

8. An in-plane lattice constant adjusted substrate, characterized in that it comprises a $SrTiO_3$ crystalline substrate and having a thin film of $BaTiO_3$ formed thereon, wherein the BaTiO$_3$ thin film has its top surface flattened to an atomic level and is substantially equal in lattice constant to BaTiO$_3$ bulk crystal.

9. An in-plane lattice constant adjusted substrate, characterized in that it comprises a SrTiO$_3$ crystalline substrate and having a thin film of BaTiO$_3$ formed thereon and a thin film of Ba$_x$Sr$_{1-x}$TiO$_3$ (where 0<x<1) formed on the BaTiO$_3$ thin film, wherein the Ba$_x$Sr$_{1-x}$TiO$_3$ thin film has its top surface flattened to an atomic level and has its in-plate lattice constant adjustable to a desired length between the lattice constants of SrTiO$_3$ and BaTiO$_3$ bulk crystals by selecting x.

* * * * *